United States Patent
Tseng et al.

(10) Patent No.: US 10,598,688 B2
(45) Date of Patent: Mar. 24, 2020

(54) OSCILLATION CONTROL SYSTEM AND OSCILLATION CONTROL METHOD

(71) Applicant: I-SHOU UNIVERSITY, Kaohsiung (TW)

(72) Inventors: Yuan-Wei Tseng, Kaohsiung (TW); Rong-Ching Wu, Kaohsiung (TW); Chia-Chuan Tsai, Kaohsiung (TW)

(73) Assignee: I-SHOU UNIVERSITY, Kaohsiung (TW)

( * ) Notice: Subject to any disclaimer, the term of this patent is extended or adjusted under 35 U.S.C. 154(b) by 10 days.

(21) Appl. No.: 16/127,302

(22) Filed: Sep. 11, 2018

(65) Prior Publication Data
US 2020/0003799 A1    Jan. 2, 2020

(30) Foreign Application Priority Data
Jul. 2, 2018    (TW) .............. 107122838 A

(51) Int. Cl.
*G01P 15/00*    (2006.01)
*G01P 15/09*    (2006.01)
(Continued)

(52) U.S. Cl.
CPC ............ *G01P 15/09* (2013.01); *H01L 41/042* (2013.01); *H01L 41/0825* (2013.01); *H03B 5/32* (2013.01);
(Continued)

(58) Field of Classification Search
CPC .... G01P 15/09; H01L 41/042; H01L 41/0825; H01L 41/1132; H03B 5/32; H03B 2200/0066; G05B 13/024
(Continued)

(56) References Cited

U.S. PATENT DOCUMENTS 9,403,667 B2    8/2016    McCabe et al.
9,407,201 B1*   8/2016    Iguchi ................... H03B 5/364
(Continued)

FOREIGN PATENT DOCUMENTS

CN    102701112 B    4/2016
TW    200951476 A1   12/2009
(Continued)

OTHER PUBLICATIONS

Yuan-Wei Tseng, Optimal Tracking Control of Nano-positioner in Reciprocal State Space Framework, 2010, IEEE, p. 56-61, vol. 4.

*Primary Examiner* — Max H Noori
(74) *Attorney, Agent, or Firm* — WPAT, PC

(57) ABSTRACT

An oscillation control system includes an actuator, a sensor unit, and a control module. An actuator includes at least one piezoelectric material coupled with an electrode. The sensor unit is located on the actuator and is configured to detect an acceleration value of deformation of the actuator. A control module includes an operational unit and a gain unit. The operational unit generates an operational result according to the acceleration value and conditions of the actuator. The gain unit is coupled to the operational unit and the electrode and is configured to convert the operational result into a control signal which adjusts the actuator. An oscillation control method includes using a reciprocal state space system to proceed with closed-loop control of a state derivative feedback. The reciprocal state space system is represented by a plurality of equations.

7 Claims, 2 Drawing Sheets

(51) Int. Cl.
    *H01L 41/08*     (2006.01)
    *H01L 41/04*     (2006.01)
    *H03B 5/32*     (2006.01)
    *H01L 41/113*     (2006.01)
    *G05B 13/02*     (2006.01)

(52) U.S. Cl.
    CPC ........ *G05B 13/024* (2013.01); *H01L 41/1132* (2013.01); *H03B 2200/0066* (2013.01)

(58) Field of Classification Search
    USPC .......................................................... 73/778
    See application file for complete search history.

(56) References Cited

U.S. PATENT DOCUMENTS

| | | |
|---|---|---|
| 10,122,310 B2 | 11/2018 | Li et al. |
| 2002/0008518 A1* | 1/2002 | Arz ........................ G01R 33/28 |
| | | 324/322 |
| 2005/0037862 A1* | 2/2005 | Hagood ................. A63B 53/04 |
| | | 473/222 |
| 2009/0224836 A1* | 9/2009 | Orberk .................... H03B 5/04 |
| | | 331/15 |
| 2009/0224844 A1* | 9/2009 | Orberk .................. H03B 5/366 |
| | | 331/183 |
| 2011/0126630 A1 | 6/2011 | Fraanje et al. |
| 2011/0133049 A1 | 6/2011 | Wang et al. |

FOREIGN PATENT DOCUMENTS

| | | |
|---|---|---|
| TW | 201120331 A1 | 6/2011 |
| WO | 2017113651 A1 | 7/2017 |

\* cited by examiner

OSCILLATION CONTROL SYSTEM AND OSCILLATION CONTROL METHOD

CROSS REFERENCE TO RELATED APPLICATION

The application claims the benefit of Taiwan application serial No. 107122838, filed on Jul. 2, 2018, and the entire contents of which are incorporated herein by reference.

BACKGROUND OF THE INVENTION

1. Field of the Invention

The present invention relates to an oscillation control system and an oscillation control method and, more particularly, to an oscillation control system and an oscillation control method providing a quick reaction speed and accurate displacement control.

2. Description of the Related Art

The amplitude displacement smaller than 1 mm is required in the fields of optics, precision machinery, and micromotors. Moreover, a technology controlling the displacement precision to be in the order of 0.01 mm can use the piezoelectric effect which is a conversion between the electrical energy and the mechanical energy. A voltage is applied to a piezoelectric material which resists the change and, thus, generates mechanical deformation. Since the voltage value is easy to control, can be rapidly adjusted, and has high accuracy, changing the shape of the piezoelectric material through control of the voltage can achieve the operational requirements of accurate displacement control.

However, the operational voltage value is not completely linearly related to the deformation displacement due to the hysteresis of piezoelectric materials, such that the same voltage value renders different displacements in the step-up procedure and the step-down procedure. Thus, adjustment of the input voltage through feedback control is required in the high precision processing of the piezoelectric material to attain the desired result of the corrected displacement.

Ordinary feedback control can be represented as a State Space system. Then, the state feedback is used to express the state, output (measurement signal), and input (feedback signal) in terms of a vector or a matrix, such that the mathematic model are not affected by the number of the states, outputs, and inputs, which can attain effective control on systems having multiple inputs and multiple outputs. Conventional equations of a state space system are as follows:

$\dot{x}=\bar{A}x+\bar{B}u$(state space system equation)

$y=\bar{C}x$(state output)

$u=-\bar{K}y=-\bar{K}\bar{C}x$(feedback input of state output)

$\dot{x}=\bar{A}x+\bar{B}u=(\bar{A}-\bar{B}\bar{K}\bar{C})x$(state space closed-loop system equation)

wherein x is a state vector, $\dot{x}$ is a state derivative vector which is the first order differential equation of the state vector x, y is an output vector, u is an input vector, $\bar{A}$ is a state space system matrix, $\bar{B}$ is an input matrix, $\bar{C}$ is a state output matrix, and $\bar{K}$ is a state output feedback gain. Thus, for state space system, the state derivative vector $\dot{x}$ can be expressed as an explicit function of the state vector x and the input vector u.

Accelerometers are commonly used in detecting deformation acceleration value of a piezoelectric material. However, the acceleration can only be expressed by the state derivative rather than the state vector, the popular state related feedback methods in state space system form are not suitable to carry out control designs for systems with accelerometers as sensors. Generally, the feedback control of the piezoelectric material requires using the state derivative feedback to proceed with complicated and effect-limited operations in the conventional state space system. Alternatively, more integrators or extra computers are used to proceed with integral operations of the acceleration value to obtain the speed value and displacement value which are expressed in terms of a state vector, and the state feedback control can then be conducted in an easier manner. Both the above two methods require additional costs in edition or equipment, and the operations are not efficient.

Improvement to the conventional control methods is, thus, necessary.

SUMMARY OF THE INVENTION

To solve the above problems, an objective of the present invention is to provide an oscillation control system and an oscillation control method which directly proceed with feedback control with measured data without using extra integrators or computers, thereby avoiding complicated operations and simplifying the system.

An oscillation control system according to the present invention includes an actuator, a sensor unit, and a control module. An actuator includes at least one piezoelectric material coupled with an electrode. The sensor unit is located on the actuator and is configured to detect an acceleration value of deformation of the actuator. A control module includes an operational unit and a gain unit. The operational unit generates an operational result according to the acceleration value and conditions of the actuator. The gain unit is coupled to the operational unit and the electrode and is configured to convert the operational result into a control signal which adjusts the actuator.

An oscillation control method according to the present invention includes using a reciprocal state space system to proceed with closed-loop control of a state derivative feedback. The reciprocal state space system is represented by a plurality of equations. The plurality of equations includes:

$x=A\dot{x}+Bu$(reciprocal state space system equation)

$y=C\dot{x}$(state derivative output)

$u=-Ky=-KC\dot{x}$(feedback input of state derivative output)

$x=A\dot{x}+Bu=(A-BKC)\dot{x}$(reciprocal state space closed-loop system equation)

wherein x is a state vector, $\dot{x}$ is a state derivative vector which is the first order differential equation of the state vector x, y is an output vector, u is an input vector, A is a reciprocal state space system matrix, B is an input matrix, C is an state derivative output matrix, and K is a state derivative output feedback gain.

Thus, the oscillation control system and the oscillation control method according to the present invention use a reciprocal state space system opposite to the conventional state space system. In contrast to conventional state space system, the state vector x can be expressed as an explicit function of the state derivative vector $\dot{x}$ and the input vector u in reciprocal state space system. Thus, the reciprocal state space system can directly introduce the measured acceleration value for concisely editing the state derivative feedback without using extra devices for integral operations, thereby attaining effects of fast and accurate control and a reduction in the editing costs.

In an example, the reciprocal state space system matrix and the input matrix represent component characteristics and structure of an actuator, and the state vector and the state derivative represent deformation, deformation velocity and deformation acceleration of the actuator. Thus, a set including all possible states of the actuator is created to conveniently analyze the actuator and to create a model.

In an example, the output matrix represents a location of a sensor unit on the actuator, and the output vector represents a detection value of the sensor unit. Thus, a set including all possible deformation velocity and deformation acceleration in form of state derivative output vector of the actuator detected by the sensor unit are created to conveniently analyze the deformation, deformation velocity and deformation acceleration of the actuator and to create a model.

In an example, the detection value represented by the output vector includes an acceleration value. Thus, the sensor unit can be an ordinary accelerometer, and differential and integral operations are not required, attaining effects of rapid operations and costs saving.

In an example, the output vector operates the actuator by the input vector through the feedback gain. Thus, the deformation state of the actuator can be controlled.

In an example, the feedback gain is adjusted to stabilize a closed-loop procedure including the reciprocal state space system matrix, the input matrix, and the output matrix. Thus, editing of the operational procedures can be simplified through the feedback gain control system, attaining fast stability and accurate control.

The present invention will become clearer in light of the following detailed description of illustrative embodiments of this invention described in connection with the drawings.

DETAILED DESCRIPTION OF THE INVENTION

Figure 1:
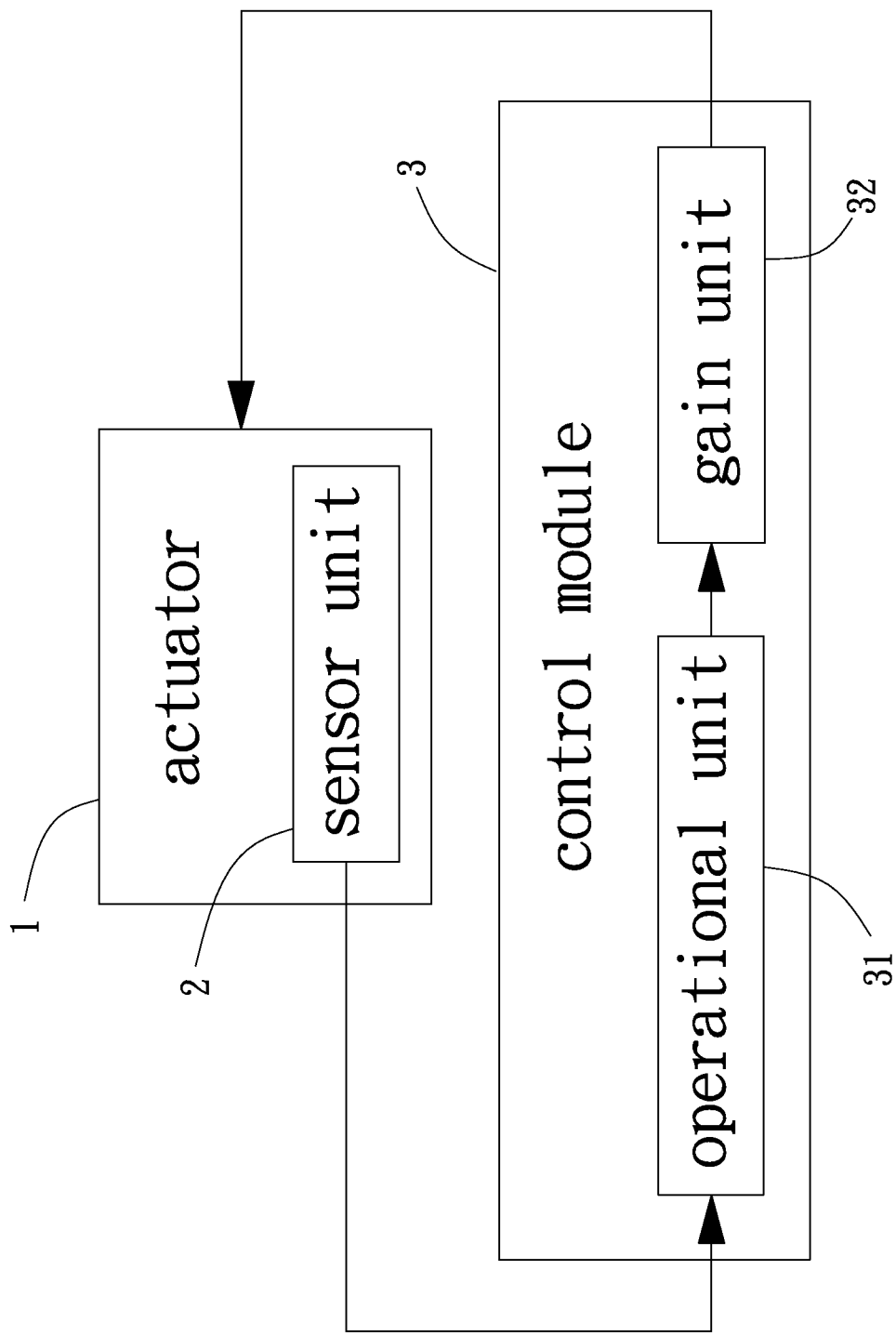
FIG. 1 is a block diagram of an oscillation control system of an embodiment according to the present invention.

With reference to FIG. 1, an oscillation control system of an embodiment according to the present invention includes an actuator 1, a sensor unit 2, and a control module 3. The sensor unit 2 is located on the actuator 1. The control module 3 is coupled to the actuator 1 and the sensor unit 2.

The actuator 1 includes at least one piezoelectric material coupled with an electrode. The piezoelectric material can be a copolymer of polyvinylidene difluoride (PVDF). When the electrode applies an electric field to the piezoelectric material, the piezoelectric material elongates in the direction of the electric field and causes curving and deformation of the actuator 1.

The sensor unit 2 can be an acceleration sensor and is preferably located on a curved face of the actuator 1. The sensor unit 2 is configured to detect an acceleration value of the deformation of the actuator 1.

The control module 3 includes an operational unit 31 which can be a microprocessor. The operational unit 31 processes the acceleration value detected by the sensor unit 2 as well as the mass, rigidity, electrode position, operational voltage value of the actuator 1. The operational unit 31 can generate an operational result for use on the feedback control. The control module 3 further includes a gain unit 32 which can be an operational amplifier. The gain unit 32 is coupled to the operational unit 31 and the electrode. The gain unit 32 is configured to convert the operational result into a control signal for adjusting the change of the actuator 1.

Figure 2:
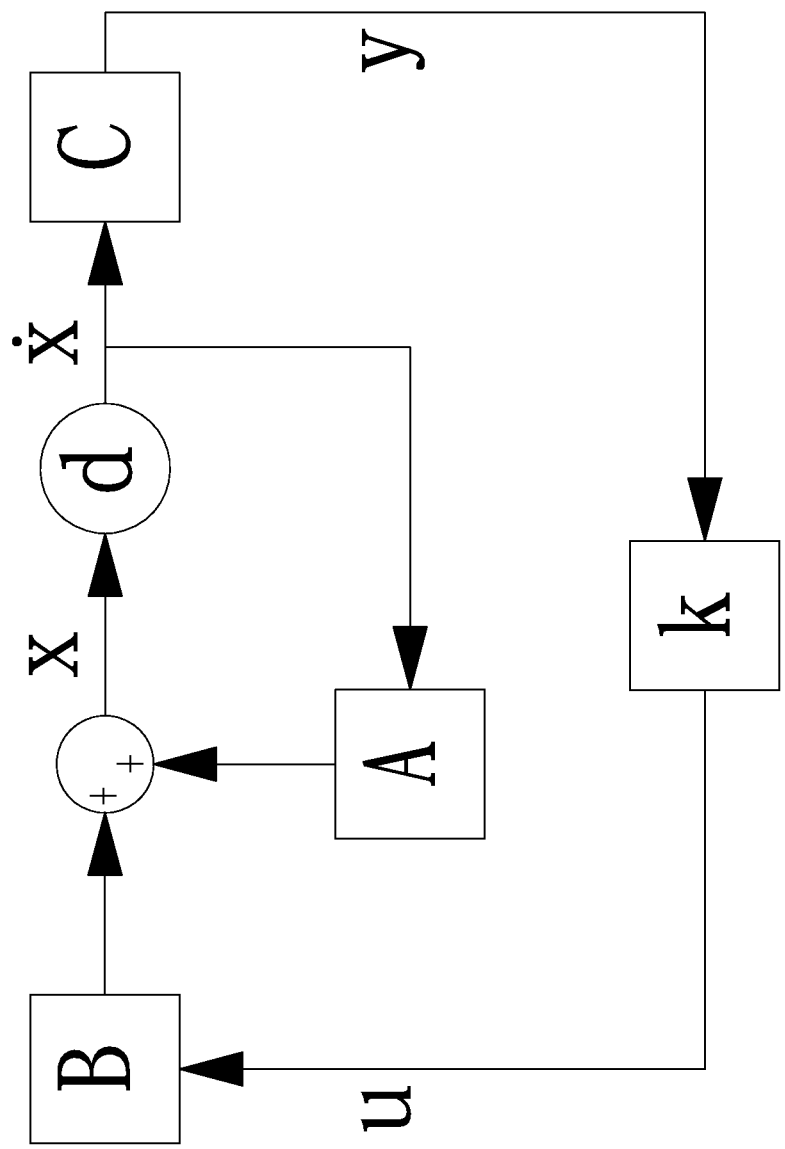
FIG. 2 is an operational flowchart illustrating an oscillation control method of an embodiment according to the present invention.

FIG. 2 shows an operational flowchart illustrating an oscillation control method of an embodiment according to the present invention. The oscillation control method uses a reciprocal state space system (RSS). A state vector x represents a state parameter while $\dot{x}$ is a state derivative vector, an output vector y represents a state derivative output measurement signal, and an input vector u represents a control signal. Thus, the state derivative output feedback can be concisely edited, and operations can be conducted through a plurality of equations to attain the closed-loop control.

The plurality of equations of the reciprocal state space system includes:

$x = A\dot{x} + Bu$ (reciprocal state space system equation)

$y = C\dot{x}$ (state derivative output)

$u = -Ky = -KC\dot{x}$ (feedback input of state derivative output)

$x = A\dot{x} + Bu = (A - BKC)\dot{x}$ (reciprocal state space closed-loop system equation)

wherein $\dot{x}$ is a state derivative vector which is the first order differential equation of the state vector x, A is a reciprocal state space system matrix, B is an input matrix, C is an state derivative output matrix, and K is a state derivative output feedback gain.

In the embodiment of the oscillation control method according to the present invention, the state vector x can be $$\begin{bmatrix} q \\ \dot{q} \end{bmatrix}, \text{ and } \dot{x} = \begin{bmatrix} \dot{q} \\ \ddot{q} \end{bmatrix},$$

wherein q is the displacement, $\dot{q}$ is the velocity, and $\ddot{q}$ is the acceleration. The state matrix A can represent the mass, rigidity and electrification characteristics of the actuator 1. The input matrix B can represent the rigidity, electrification characteristics, and potential difference of the actuator 1. The output vector y is the acceleration value detected by the sensor unit 2. The output matric C can be [0 c]. Thus, $$y = C\dot{x} = \begin{bmatrix} 0 & c \end{bmatrix} \begin{bmatrix} \dot{q} \\ \ddot{q} \end{bmatrix} = c\ddot{q},$$

wherein c is correlated to the location of the sensor unit 2 on the actuator 1. Thus, the acceleration value detected by the sensor unit 2 can be directly used in the reciprocal state space system without extra integrators, providing operational accuracy and a rapid effect. The input vector u can be the amount of electricity input to the actuator 1.

The reciprocal state space system equation of the closed-loop system can be expressed as $x=(A-BKC)\dot{x}$. The eigenvalues of the matrix (A−BKC) is the reciprocals of the eigenvalues of the closed-loop system. By editing the state derivative output feedback gain K, the real parts of the eigenvalues of the matrix (A−BKC) are all negative. Furthermore, the real parts of the reciprocals of any complex numbers whose real parts are negative are still negative. Thus, the real parts of the eigenvalues of the closed-loop system are all negative. According to Lyapunov Stability theory, when the real parts of the eigenvalues of the closed-loop system are all negative, the closed-loop system approaches stable. Thus, the editing rules can be simplified to attain fast stability and accurate control.

In view of the foregoing, the oscillation control system and the oscillation control method according to the present invention use a reciprocal state space system to directly introduce the measured acceleration value for concisely editing the state derivative output feedback without using extra devices for integral operations, thereby attaining effects of fast and accurate control and a reduction in the editing costs.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. An oscillation control system comprising:
   an actuator including at least one piezoelectric material coupled with an electrode;
   a sensor unit located on the actuator and configured to detect an acceleration value of deformation of the actuator; and
   a control module including an operational unit and a gain unit, wherein the operational unit generates an operational result according to the acceleration value and conditions of the actuator, wherein the gain unit is coupled to the operational unit and the electrode and is configured to convert the operational result into a control signal which adjusts the actuator.

2. An oscillation control method comprising using a reciprocal state space system to proceed with closed-loop control of a state derivative feedback, wherein the reciprocal state space system is represented by a plurality of equations and calculates the acceleration value and the conditions of the actuator of the oscillation control system as claimed in claim 1, wherein the plurality of equations includes:

$$x = A\dot{x} + Bu \text{(reciprocal state space system equation)}$$

$$y = C\dot{x} \text{(state derivative output)}$$

$$u = -Ky = -KC\dot{x} \text{(feedback input of state derivative output)}$$

$$x = A\dot{x} + Bu = (A - BKC)\dot{x} \text{(reciprocal state space closed-loop system equation)}$$

wherein x is a state vector, $\dot{x}$ is a state derivative vector which is a first order differential equation of the state vector x, y is an output vector of the acceleration value, u is an input vector, A is a reciprocal state space system matrix, B is an input matrix indicative of at least one property of the actuator, C is an state derivative output matrix, and K is a state derivative output feedback gain.

3. The oscillation control method as claimed in claim 2, wherein the reciprocal state space system matrix and the input matrix represent component characteristics and structure of an actuator, and wherein the state vector and the state derivative represent a deformation, a deformation velocity and a deformation acceleration of the actuator.

4. The oscillation control method as claimed in claim 3, wherein the output matrix represents a location of a sensor unit on the actuator, and wherein the output vector represents a detection value of the sensor unit.

5. The oscillation control method as claimed in claim 4, wherein the detection value represented by the output vector includes an acceleration value.

6. The oscillation control method as claimed in claim 4, wherein the output vector operates the actuator by the input vector through the feedback gain.

7. The oscillation control method as claimed in claim 6, wherein the feedback gain is adjusted to stabilize a closed-loop procedure including the reciprocal state space system matrix, the input matrix, and the output matrix.

* * * * *